US008419171B2

(12) United States Patent
Naono et al.

(10) Patent No.: US 8,419,171 B2
(45) Date of Patent: Apr. 16, 2013

(54) COLUMNAR STRUCTURE FILM AND METHOD OF FORMING SAME, PIEZOELECTRIC ELEMENT, LIQUID EJECTION APPARATUS AND PIEZOELECTRIC ULTRASONIC OSCILLATOR

(75) Inventors: Takayuki Naono, Ashigarakami-gun (JP); Takamichi Fujii, Ashigarakami-gun (JP); Takami Arakawa, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 275 days.

(21) Appl. No.: 12/855,627

(22) Filed: Aug. 12, 2010

(65) Prior Publication Data

US 2011/0037812 A1 Feb. 17, 2011

(30) Foreign Application Priority Data

Aug. 14, 2009 (JP) ................................. 2009-188098

(51) Int. Cl.
*B41J 2/045* (2006.01)
*H01L 41/04* (2006.01)
(52) U.S. Cl.
USPC ........................................... 347/68; 310/367

(58) Field of Classification Search .................... 347/68, 347/70–72; 310/367
See application file for complete search history.

(56) References Cited

U.S. PATENT DOCUMENTS

| 7,049,756 B2* | 5/2006 | Aiba et al. .................... 315/172 |
| 2003/0222947 A1* | 12/2003 | Tomozawa et al. ............. 347/68 |
| 2010/0079552 A1* | 4/2010 | Arakawa et al. ................ 347/68 |

FOREIGN PATENT DOCUMENTS

| JP | 2000-307163 | 2/2000 |
| JP | 2007-335779 | 12/2007 |

OTHER PUBLICATIONS

Machine Translation of JP 2000307163A.*

* cited by examiner

*Primary Examiner* — Kristal Feggins
*Assistant Examiner* — Lisa M Solomon
(74) *Attorney, Agent, or Firm* — Fish & Richardson P.C.

(57) ABSTRACT

The columnar structure film is formed on a surface of a substrate by vapor phase epitaxy, and is constituted of a plurality of columnar bodies extending in directions non-parallel to the surface of the substrate. In the columnar structure film, a relationship $GS_{max} > 2.0\ GS_{min}$ is satisfied, where $GS_{max}$ and $GS_{min}$ are respectively a maximum value and a minimum value of average diameters of the columnar bodies taken in planes perpendicular to a thickness direction of the columnar structure film.

17 Claims, 5 Drawing Sheets

EXPERIMENTAL EXAMPLE 1

EXPERIMENTAL EXAMPLE 2

COLUMNAR STRUCTURE FILM AND METHOD OF FORMING SAME, PIEZOELECTRIC ELEMENT, LIQUID EJECTION APPARATUS AND PIEZOELECTRIC ULTRASONIC OSCILLATOR

BACKGROUND OF THE INVENTION

1. Field of the Invention

The present invention relates to a columnar structure film, a method of manufacturing same, a piezoelectric element having a piezoelectric film composed of a columnar structure film, a liquid ejection apparatus using same, and a piezoelectric ultrasonic oscillator.

2. Description of the Related Art

Piezoelectric elements are used in applications such as piezoelectric actuators mounted in inkjet recording heads. A piezoelectric element has a piezoelectric body that expands and contracts with increase and decrease in the intensity of an applied electric field, and electrodes through which the electric field is applied to the piezoelectric body. Known piezoelectric materials are lead zirconate titanate (PZT), or substituted PZT in which a portion of the A site and/or B site of the PZT is substituted with another element.

Taking account of the compactification and reduction in thickness of piezoelectric elements, it is desirable that the piezoelectric body is composed of a thin film. For example, such thin film can be a monocrystalline film, which has high voltage tolerance and high durability since there are no grain boundaries in the monocrystalline film. However, with monocrystalline films, the film formation rate is extremely slow, productivity is low, and formation over a large surface area is difficult, which means that practical applicability is poor. On the other hand, in a case where a piezoelectric body is constituted of a thin film having a polycrystalline structure, the piezoelectric body has voltage tolerance lower than cases where a bulk member having a large film thickness is used, and if driven repeatedly by applying voltage, there is a tendency for the insulation to break down and deterioration of displacement occurs readily.

A known film structure for a piezoelectric film having a polycrystalline structure is a columnar film structure constituted of a plurality of column-shaped bodies which extend in directions non-parallel to a substrate surface. Japanese Patent Application Publication Nos. 2000-307163 and 2007-335779 disclose layered structures of varying grain size in piezoelectric films having columnar film structures.

Japanese Patent Application Publication No. 2000-307163 discloses that a structure is formed in such a manner that the grain boundaries in the piezoelectric film are discontinuous in the film thickness direction. It is also disclosed that a piezoelectric film has crystalline structures layered in the film thickness direction, and the layers are formed in such a manner that the grain sizes in adjacent layers are mutually different. It is described that the composition reduces leakage paths and thereby improves voltage tolerance (paragraph 0049, for example). The layered structure is obtained by means of a sol gelation method (paragraphs 0024 to 0033, for example); more specifically, by repeating, a plurality of times under different conditions, a step of applying a liquid containing metal alkoxides including the constituent metals of the piezoelectric body onto a substrate, and subsequently carrying out heat treatment. In the layered structure, the grain size in the first layer is 3000 nm to 4000 nm, the grain size in the second layer is 50 nm to 80 nm, and the grain size in the third layer is 100 nm to 500 nm (paragraphs 0028, 0030 and 0031, for example).

Japanese Patent Application Publication No. 2007-335779 discloses a piezoelectric film having a layered structure constituted of a layer containing a larger amount of lead than the stoichiometric proportion and a layer containing a smaller amount of lead than the stoichiometric proportion, and describes that the leakage paths due to lead dioxide are shut off and the durability is improved by means of this composition (paragraphs 0019 to 0020, for example). It is also described that the number of occurrences of leakage paths can be reduced by increasing the grain size in the layer having a large amount of lead (paragraph 0036, for example). The piezoelectric film having the layered structure is formed by sputtering (paragraphs 0042 and 0065, for example). The piezoelectric film has a ratio of "grain size in film with large amount of lead"/"grain size in film with small amount of lead"=2.0 (paragraphs 0045 and 0068, for example).

Both Japanese Patent Application Publication Nos. 2000-307163 and 2007-335779 propose piezoelectric films having layered structures with varying grain sizes, but do not specifically investigate how far the grain size should be varied.

In Japanese Patent Application Publication No. 2000-307163, the layered structure described above is obtained by a sol gelation method which repeats, a plurality of times under different conditions, a step of applying a liquid containing metal alkoxides including the constituent metals of the piezoelectric body onto a substrate, and subsequently carrying out heat treatment. In this method, the process is complicated and it takes time to form the piezoelectric film. It is also difficult to form the piezoelectric film to a small thickness.

SUMMARY OF THE INVENTION

The present invention has been contrived in view of these circumstances, an object thereof being to provide a piezoelectric film having excellent voltage tolerance and excellent driving durability, which can be formed without requiring a complicated process.

In order to attain the aforementioned object, the present invention is directed to a columnar structure film which is formed on a surface of a substrate by vapor phase epitaxy and is constituted of a plurality of columnar bodies extending in directions non-parallel to the surface of the substrate, wherein a relationship $GS_{max} > 2.0\, GS_{min}$ is satisfied, where $GS_{max}$ and $GS_{min}$ are respectively a maximum value and a minimum value of average diameters of the columnar bodies taken in planes perpendicular to a thickness direction of the columnar structure film.

In the present specification, the average diameters of the columnar bodies are determined from a cross-sectional electron backscatter diffraction (EBSD) image. In the plane perpendicular to the film thickness direction at any position in the film thickness direction, the diameters of all of the columnar bodies are determined, and the average of these diameters is derived as the average diameter of the columnar bodies taken in the plane perpendicular to the thickness direction of the columnar structure film. In the present specification, the relationship between the position in the film thickness direction and the average diameter of the columnar bodies is determined, and $GS_{max}$ and $GS_{min}$ are determined as shown by the measurement examples in Table 1 and FIG. 7.

In the present specification, a DC voltage is applied between the lower electrode and the upper electrode, and the voltage tolerance is measured by taking the point at which the current value becomes 1 µA or greater, as the insulation breakdown voltage. The voltage tolerance is measured in five points on different upper electrodes, and the average value thereof is determined.

In order to attain the aforementioned object, the present invention is also directed to a piezoelectric element, comprising: a piezoelectric film composed of the above-described columnar structure film; and electrodes through which an electric field is applied to the piezoelectric film.

In order to attain the aforementioned object, the present invention is also directed to a liquid ejection apparatus, comprising: the above-described piezoelectric element; and a liquid ejection member which is arranged adjacently to the piezoelectric element, wherein the liquid ejection member includes a liquid storage chamber in which liquid is stored, and a liquid ejection port through which the liquid is ejected to exterior from the liquid storage chamber in accordance with application of the electric field to the piezoelectric film.

In order to attain the aforementioned object, the present invention is also directed to a piezoelectric ultrasonic oscillator, comprising: the above-described piezoelectric element; an AC power source which applies an alternating voltage to the electrodes; and a diaphragm which vibrates due to expansion and contraction of the piezoelectric film.

According to the present invention, it is possible to provide a columnar structure film having excellent voltage tolerance and excellent driving durability. The present invention can be applied to any film having a columnar film structure constituted of columnar bodies which extend in non-parallel directions to the substrate surface. The present invention can be applied to a piezoelectric film having a columnar structure, or the like. Since the piezoelectric film according to the present invention has high voltage tolerance, then it is possible to set a high maximum applied voltage. In applications such as liquid ejection apparatuses, or the like, it is desirable to set the maximum applied voltage to a high value, since this makes it possible to displace the piezoelectric film by a large amount.

BRIEF DESCRIPTION OF THE DRAWINGS

The nature of this invention, as well as other objects and advantages thereof, will be explained in the following with reference to the accompanying drawings, in which like reference characters designate the same or similar parts throughout the figures and wherein.

DESCRIPTION OF THE PREFERRED EMBODIMENTS

Columnar Structure Film

Figure 1:
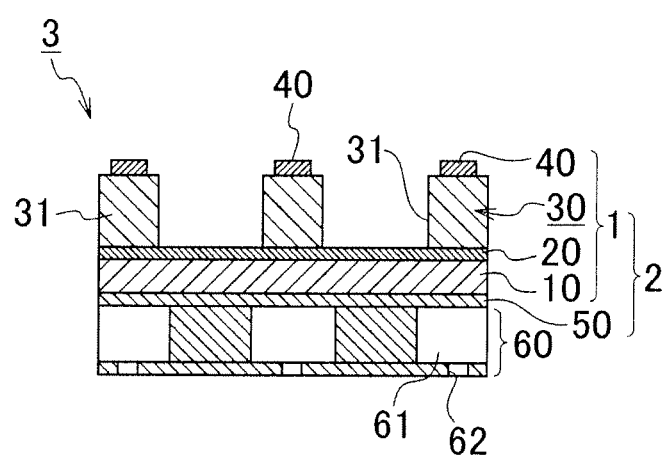
FIG. 1 is a cross-sectional diagram showing the structure of a piezoelectric element and an inkjet recording head according to an embodiment of the present invention.

The present inventors achieved a columnar structure film which satisfies $GS_{max} > 2.0\, GS_{min}$, where $GS_{max}$ and $GS_{min}$ are the maximum value and the minimum value of the average column diameters taken in respective planes perpendicular to the film thickness direction, by adjusting the film formation conditions of the vapor phase epitaxy process. The present inventors also achieved films satisfying $GS_{max} \geq 2.5\, GS_{min}$, $GS_{max} \geq 3.0\, GS_{min}$, and $GS_{max} \geq 3.5\, GS_{min}$ (see FIG. 8). The present inventors have realized that voltage tolerance is improved and driving durability is improved, as the ratio of $GS_{max}/GS_{min}$ becomes greater.

In a film structure having a large $GS_{max}/GS_{min}$ ratio, the probability that the grain boundaries in the film thickness direction will pass through from the lower surface to the upper surface of the film becomes lower, the leakage paths decrease in number, and therefore voltage tolerance improves and driving durability improves.

More specifically, a columnar structure film according to an embodiment of the present invention is formed on a substrate, and is constituted of a plurality of columnar bodies extending in non-parallel directions to the surface of the substrate, the film being formed by vapor phase epitaxy, and the relationship $GS_{min} > 2.0\, GS_{min}$ being satisfied where $GS_{max}$ and $GS_{min}$ are the maximum value and the minimum value of the average column diameters taken in respective planes perpendicular to the film thickness direction.

The columnar structure film according to the embodiment of the present invention desirably satisfies $GS_{max} \geq 2.5\, GS_{min}$, and particularly desirably, satisfies $GS_{max} \geq 3.0\, GS_{min}$.

The "columnar structure film" referred to in the present specification is a columnar structure film as described in Movchan and Demchishin, Phys. Met. Metallogr., 28, 83 (1969); Thornton, J. Vac. Sci. Technol., 11, 666 (1974); and the like. The columnar structure film may have either a crystalline structure or an amorphous structure, but desirably has a crystalline structure. If the film has a crystalline structure, then the individual columnar bodies form columnar crystal grains.

According to an embodiment of the present invention, it is possible to provide a columnar structure film in which the insulation breakdown voltage defined by the applied voltage at which the current value becomes 1 µA or greater is 300 kV/cm or greater. According to an embodiment of the present invention, it is also possible to provide a columnar structure film in which the insulation breakdown voltage is not lower than 400 kV/cm, it is also possible to provide a columnar structure film in which the insulation breakdown voltage is not lower than 500 kV/cm, and it is also possible to provide a columnar structure film in which the insulation breakdown voltage is not lower than 600 kV/cm (see FIG. 8).

In vapor phase epitaxy, taking account of the fact that the grain structure of the depositional surface on which the film forming particles are deposited has a significant effect on the growth of the columnar bodies and that the growth of the columnar bodies proceeds in the lateral direction as well as the direction perpendicular to the depositional surface, then it is comparatively easier to grow columnar bodies having a relatively large average column diameter over columnar bodies having a relatively small average column diameter, than to grow columnar bodies having a relatively small average column diameter over columnar bodies having a relatively large average column diameter. Consequently, in the columnar structure film according to an embodiment of the present invention, it is preferable that, among the average column diameters taken in respective planes perpendicular to the film thickness direction, the average column diameter in the plane at the film surface adjacent to the substrate is smallest, and the average column diameter in the plane at the film surface opposite from the substrate is largest.

The present inventors have realized that there is no satisfactory correlation between $GS_{max}$ and the voltage tolerance, but that there is a satisfactory correlation between $GS_{max}/GS_{min}$ and the voltage tolerance (see Table 2).

In the columnar structure film according to an embodiment of the present invention, the average column diameter may have the variation either continuous or discontinuous along the film thickness direction. The columnar structure film according to an embodiment of the present invention may have a layered structure constituted of a plurality of clearly separated layers, or may have a single layer structure.

Figure 3:
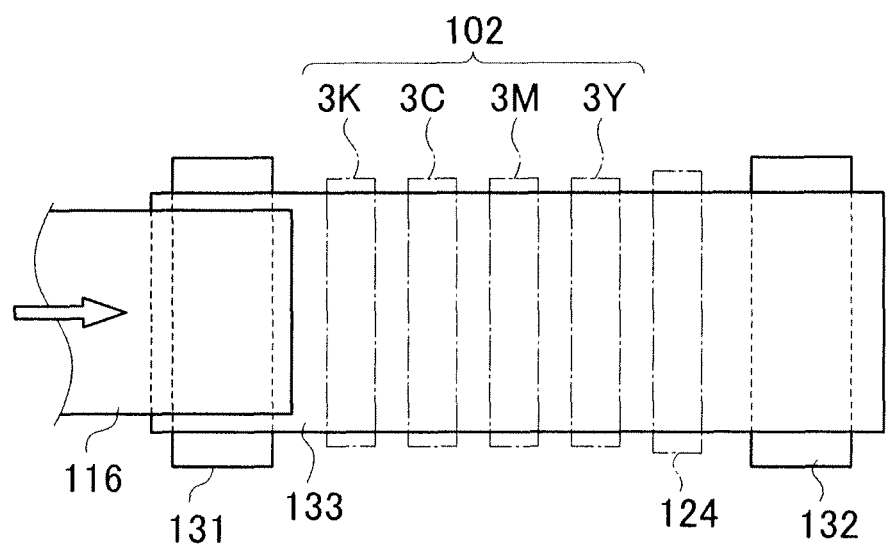
FIG. 3 is a partial plan view of the inkjet recording apparatus in FIG. 2.

For example, in Japanese Patent Application Publication No. 2000-307163, a plurality of layers are stacked in such a manner that the grain boundaries are discontinuous along the film thickness direction (paragraph 0032 and FIG. 3, for example). In a composition such as this, there is a risk of stress being applied to the interfaces between adjacent layers which have discontinuous grain boundaries, giving rise to cracks and separation of the layers.

On the other hand, in the columnar structure film according to an embodiment of the present invention, it is desirable that the average column diameters taken in respective planes perpendicular to the film thickness direction continuously vary along the film thickness direction, since this distributes the stress and makes cracks less liable to occur compared to a discontinuous structure. The columnar structure film according to an embodiment of the present invention desirably employs a single layer structure rather than a layered structure constituted of a plurality of clearly separated layers, since there is no risk of separation of the layers.

Desirably, the columnar structure film according to an embodiment of the present invention is formed by vapor phase epitaxy using plasma.

The composition of the columnar structure film according to the present invention is not limited in particular.

The columnar structure film according to an embodiment of the present invention can be employed in a dielectric film.

The columnar structure film according to an embodiment of the present invention can be employed in a piezoelectric film.

The columnar structure film according to an embodiment of the present invention can be employed in a ferroelectric film.

The composition of a columnar structure film according to an embodiment of the present invention which is consisted of a piezoelectric film or a ferroelectric film may include one or more types of perovskite type oxide (P) as expressed by the following general formula:

$$ABO_3, \tag{P}$$

where A is an A site element and at least one element including Pb; B is a B site element and at least one element selected from the group consisting of Ti, Zr, V, Nb, Ta, Sb, Cr, Mo, W, Mn, Sc, Co, Cu, In, Sn, Ga, Zn, Cd, Fe and Ni; O is oxygen; and the standard mol ratio of the A site element, the B site element and oxygen is 1:1:3, but the mol ratio may deviate from the standard mol ratio within a range that enables a perovskite structure to be obtained.

A perovskite type oxide expressed by the above-described general formula can be: one of lead-containing compounds, such as lead titanate, lead zirconate titanate (PZT), lead zirconate, lead lanthanum titanate, lead lanthanum zirconate titanate, lead magnesium niobate zirconium titanate, nickel niobate lead zirconium titanate, lead zinc niobate zirconium titanate, or the like, or mixed crystal systems of these; or one of non-lead-containing compounds, such as barium titanate, strontium barium titanate, bismuth sodium titanate, bismuth potassium titanate, sodium niobate, potassium niobate, lithium niobate, bismuth ferrite, or the like, or mixed crystal systems of these.

The piezoelectric film according to an embodiment of the present invention desirably contains one or more types of perovskite type oxide (PX) as expressed by the following formula, since this enables a high piezoelectric constant to be achieved:

$$A_a(Zr_x, Ti_y, M_{b-x-y})_b O_c, \tag{PX}$$

where A is an A site element and at least one element including Pb; M is one or more types of metal element; the relationships $0<x<b$, $0<y<b$, and $0\leqq(b-x-y)$ are satisfied; and a:b:c=1:1:3 is standard, but the mol ratio may deviate from the standard mol ratio within a range that enables a perovskite structure to be obtained.

There are no particular restrictions on M, which is one or more types of substitute element at the B site.

It is known that PZT which is doped with various donor ions having higher valence than the valence of the substituted ions has improved properties, such as piezoelectric characteristics, compared to true PZT. M is desirably one or more types of donor ion having a greater valence than tetravalent Zr or Ti. Possible examples of such donor ions are: $V^{5+}$, $Nb^{5+}$, $Ta^{5+}$, $Sb^{5+}$, $Mo^{6+}$, $W^{6+}$, and the like. The piezoelectric film according to an embodiment of the present invention desirably includes, of the perovskite type oxides (PX), a perovskite type oxide where $0<(b-x-y)$ and in which M includes at least one type of element selected from the group consisting of V, Nb, Ta and Sb.

In the perovskite type oxide (PX), there are no particular restrictions on the elements apart from Pb which may be included in the A site, and donor ions are desirable, and more specifically, at least one type of element of Bi and lanthanoid, such as La and the like, is desirable.

There are no particular restrictions on the thickness of the columnar structure film according to the present invention. The thinner the film, the lower the voltage tolerance tends to become, and therefore the present invention is especially beneficial in the case of thin films. The present invention is beneficial in thin films having a thickness of 20 μm or less, for example, and is especially beneficial in thin films having a thickness of 10 μm or less. The present invention is beneficial in thin films of 500 nm to 20 μm, and is beneficial in thin films of 500 nm to 10 μm.

The method of forming the columnar structure film according to an embodiment of the present invention is described below.

The columnar structure film according to an embodiment of the present invention is formed by controlling the film forming conditions during vapor phase epitaxy in such a manner that $GS_{max}>2.0\ GS_{min}$, desirably, $GS_{max}\geqq 2.5\ GS_{min}$, and particularly desirably, $GS_{max}\geqq 3.0\ GS_{min}$.

Research has been carried out into columnar structure films in respect of the relationship between the substrate temperature and the film forming pressure during formation, and the shape and diameter of the columnar bodies, and in respect of the category of columnar body. Research of this kind is described in detail in Movchan and Demchishin, Phys. Met. Metallogr., 28, 83 (1969) in respect of vapor deposition films; and in Thornton, J. Vac. Sci. Technol., 11, 666 (1974) in respect of sputtered films. It is possible to gauge the film formation conditions with reference to these models.

In a film formation method for a columnar structure film according to an embodiment of the present invention, desirably, film formation is carried out by vapor phase epitaxy using plasma. Sputtering method and pulsed laser deposition (PLD) method are known examples of vapor phase epitaxy using plasma.

In vapor phase epitaxy using plasma, for example, it is possible to form a columnar structure film having the film structure according to an embodiment of the present invention, by carrying out film formation by setting the film formation power, the film formation temperature, the film formation pressure, the target to substrate distance, and the substrate potential in such a manner that $GS_{max}$ and $GS_{min}$ satisfy the above-described conditions. Film formation may be carried out under the same film formation conditions from the start to the end of the process, or the conditions may be altered during the course of the film formation process.

The columnar structure film according to an embodiment of the present invention that satisfies $GS_{max} > 2.0\, GS_{min}$ can be formed, for example, by altering at least one of the film formation conditions at least one time during the film forming process. In this case, it is possible to gauge the film formation conditions with reference to the models in the aforementioned references.

When film formation is carried out by altering the conditions during the course of the film formation process, the film structure does not necessarily vary suddenly, at the instant that the film formation conditions are altered. At the time that the film formation conditions are altered, the portion of the film that has been previously formed continues under the film formation environment, such as the film formation temperature and pressure, and the film structure is in an incomplete state. Hence, at least a part of the portion of the film formed before the alteration in the film formation conditions receives the effects of the new film formation conditions, and thus a film structure that is affected by both the previous film formation conditions and the new film formation conditions is obtained. In the portion of the film formed after the alteration in the film formation conditions, the portion of film formed previously is the under layer, and hence a film structure that is affected by both the under layer and the new film formation conditions is obtained.

The present inventors successfully formed a columnar structure film in which the diameters of the columnar bodies become gradually larger, from the substrate side, by altering the film formation power during the course of the film formation process in vapor phase epitaxy using plasma (see Experimental Example 1 described below).

In vapor phase epitaxy using plasma, even if the film formation conditions are not altered during the course of the film formation process, it is still possible to form a columnar structure film according to an embodiment of the present invention that satisfies $GS_{max} > 2.0\, GS_{min}$, by suitably controlling the underlying crystalline structure and the energy of the particles to be deposited to form the film.

In the initial phase of film formation, crystal growth occurs following the underlying crystalline structure. Moreover, as the energy of the particles to be deposited becomes greater, so the growth of the columnar bodies in the lateral direction tends to become greater. Consequently, by optimizing these conditions, it is possible to control the growth of the grains in the lateral direction and thereby vary the average column diameter along the film thickness direction. As in the experimental examples shown in Table 2, the present inventors successfully formed columnar structure films in which the diameters of the columnar bodies become gradually larger from the substrate side, without altering the film formation conditions during the film formation process.

In Japanese Patent Application Publication No. 2000-307163, a layered structure is obtained by a sol gelation method that repeats, a plurality of times under different conditions, a step of applying a liquid containing metal alkoxides including the constituent metal of the piezoelectric body, onto a substrate, and subsequently carrying out heat treatment. In a method of this kind, the process is complicated and it takes time to form the piezoelectric film. Furthermore, since the average column diameters cannot be varied continuously along the film thickness direction, then the stress is concentrated at the interfaces of the different layers, and cracks are liable to occur.

One of characteristic features of the present invention is that a columnar structure film is formed by vapor phase epitaxy, and since it is possible to vary the average column diameters continuously or discontinuously along the film thickness direction without halting the film formation, the process is extremely straightforward. Furthermore, in a continuous structure in which the average column diameters are varied continuously in the film thickness direction, the stress is distributed and cracks are less liable to occur than in a discontinuous structure, and hence there is no risk of detachment between layers.

As described above, according to the present invention, it is possible to provide a columnar structure film having excellent voltage tolerance and excellent driving durability which can be formed without requiring any complicated process, and also a method of forming such a film. The present invention can be applied desirably to a piezoelectric film, or the like, having a columnar structure. Since the piezoelectric film according to the present invention has high voltage tolerance, then it is possible to set a high maximum applied voltage. In applications such as liquid ejection apparatuses, or the like, it is desirable to set the maximum applied voltage to a high value, since this makes it possible to displace the piezoelectric film by a large amount.

Piezoelectric Element and Inkjet Recording Head

Referring to FIG. 1, the structure of a piezoelectric element, and an inkjet recording head (liquid ejection apparatus) including same, according to one embodiment of the present invention is described. FIG. 1 is a principal part cross-sectional diagram of an inkjet recording head (a cross-sectional diagram in the film thickness direction of the piezoelectric element). To clarify the illustration, the scale is altered appropriately for each constituent element from the actual scale.

The piezoelectric element 1 according to the present embodiment has a lower electrode 20, a piezoelectric film 30 and an upper electrode 40, which are successively arranged on a substrate 10. The piezoelectric film 30 is constituted of the columnar structure film according to the present invention, and an electric field is applied to the piezoelectric film 30 in the film thickness direction through the lower electrode 20 and the upper electrode 40.

The lower electrode 20 is formed over substantially the whole surface of the substrate 10. The piezoelectric film 30 is formed on the lower electrode 20, and has a pattern of line-shaped projecting sections 31 arranged in a stripe configuration. The upper electrode 40 is formed on top of each projecting section 31.

The pattern of the piezoelectric film 30 is not limited to that shown, and is designed as appropriate. Furthermore, the piezoelectric film 30 may also be a continuous film. However, by forming the piezoelectric film 30 in the pattern constituted of the projecting sections 31 which are mutually separated, rather than as a continuous film, the expansion and contraction of each of the projecting sections 31 is made smooth, which is desirable since a larger amount of displacement can be obtained.

There are no particular restrictions on the substrate 10, and possible examples of the substrate material include: silicon, silica, stainless steel (SUS), yttria-stabilized zirconia (YSZ), alumina, sapphire, SiC, $SrTiO_3$, and the like. The substrate 10 may employ a layered substrate such as an SOI substrate in which an $SiO_2$ film and an Si active layer are successively arranged on a silicon substrate.

There are no particular restrictions on the composition of the lower electrode 20, and possible examples of the material of the lower electrode 20 include: metals or metal oxides such as Au, Pt, Ir, $IrO_2$, $RuO_2$, $LaNiO_3$, $SrRuO_3$, and the like; and combinations of these. There are no particular restrictions on the composition of the upper electrode 40, and possible examples of the material of the upper electrode 40 include: the materials cited above for the lower electrode 20, and electrode materials generally used in semiconductor processes, such as Al, Ta, Cr, Cu, and the like; and combinations of these. There are no particular restrictions on the thicknesses of the lower electrode 20 and the upper electrode 40, and a thickness of 50 nm to 500 nm is desirable.

A piezoelectric actuator 2 is composed of the piezoelectric element 1 and a diaphragm 50, which is attached on the lower surface of the substrate 10 of the piezoelectric element 1 and vibrates due to the expansion and contraction of the piezoelectric film 30. The piezoelectric actuator 2 also has a control device (not shown) such as a drive circuit which controls the driving of the piezoelectric element 1.

An inkjet recording head (liquid ejection apparatus) 3 includes the piezoelectric actuator 2 and an ink nozzle member (a liquid storage and ejection member) 60, which is attached on the lower surface of the piezoelectric actuator 2. The ink nozzle member 60 has ink chambers (liquid storage chambers) 61, in which ink is stored, and ink ejection ports (liquid ejection ports) 62, through which the ink is ejected to the exterior from the ink chambers 61. The ink chambers 61 are arranged in accordance with the number and pattern of the projecting sections 31 in the piezoelectric film 30. In the inkjet recording head 3, when the intensity of the electric field applied to the piezoelectric element 1 is increased or decreased, the piezoelectric element 1 expands or contracts, thereby controlling the ejection timing and ejection volume of the ink from the ink chamber 61.

Instead of attaching the separate diaphragm 50 and the separate ink nozzle member 60 to the substrate 10, it is also possible to process portions of the substrate 10 into forms of the diaphragm 50 and the ink nozzle member 60. For example, when the substrate 10 is constituted of a layered substrate, such as an SOI substrate, then ink chambers 61 can be formed by etching the substrate 10 from the lower surface side, and it is possible to form a diaphragm 50 and an ink nozzle member 60 by processing the substrate 10 itself.

The piezoelectric element 1 and the inkjet recording head 3 according to the present embodiment have the composition described above. According to the present embodiment, it is possible to provide the piezoelectric element 1 having excellent voltage tolerance and excellent driving durability.

Inkjet Recording Apparatus

Figure 2:
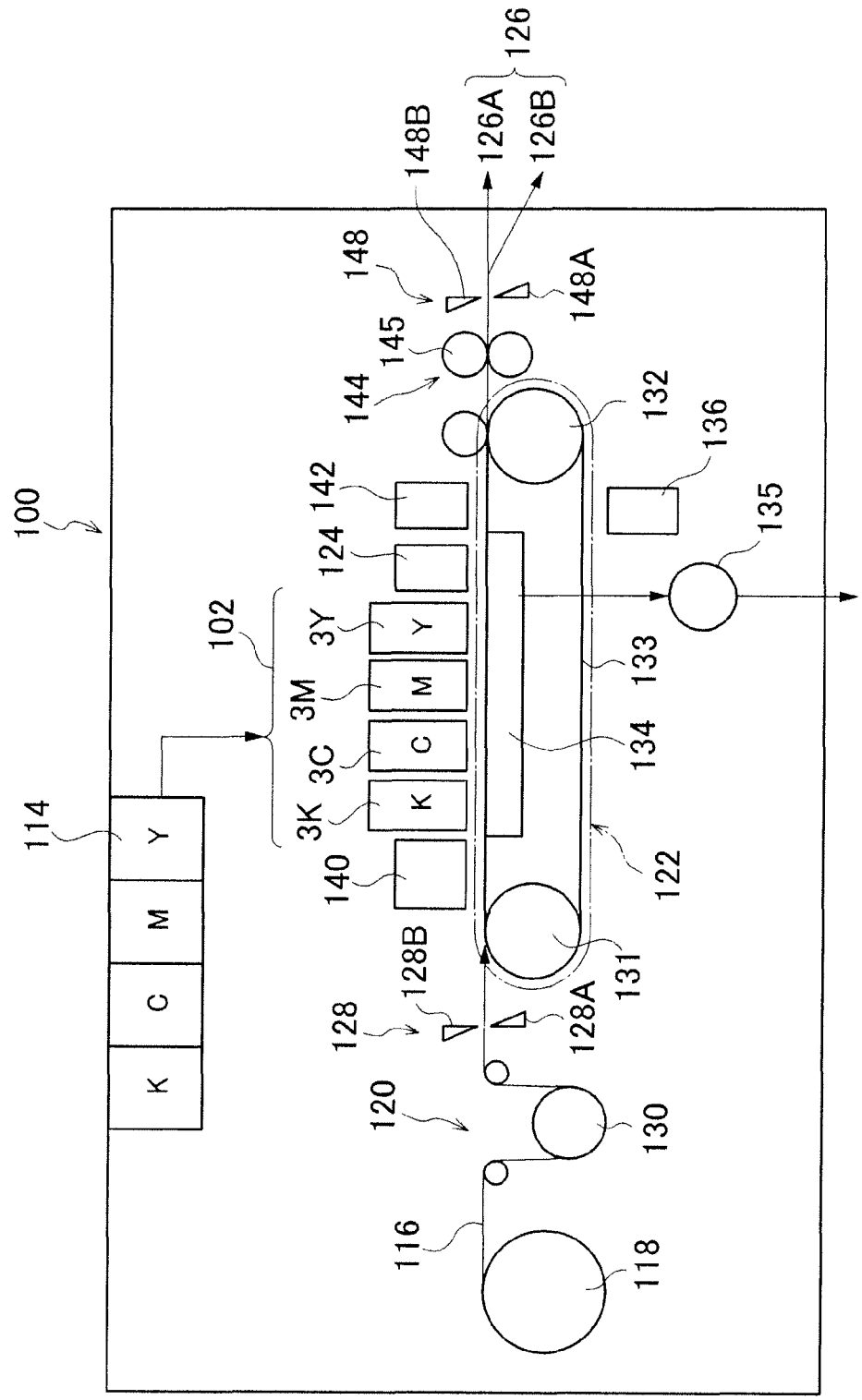
FIG. 2 is a diagram showing the composition of an inkjet recording apparatus according to an embodiment of the present invention.

A composition of an inkjet recording apparatus including the inkjet recording heads 3 according to the present embodiment is described with reference to FIGS. 2 and 3. FIG. 2 is a general schematic drawing of an inkjet recording apparatus 100, and FIG. 3 is a partial plan view of same.

The inkjet recording apparatus 100 shown in FIGS. 2 and 3 includes: a print unit 102 having a plurality of inkjet recording heads (hereinafter referred to simply as "heads") 3K, 3C, 3M and 3Y, which are provided correspondingly to colors of ink; an ink storing and loading unit 114, which stores the ink to be supplied to the heads 3K, 3C, 3M and 3Y; a paper supply unit 118, which supplies recording paper 116; a decurling unit 120, which removes curl from the recording paper 116; a suction belt conveyance unit 122, which is disposed so as to oppose the nozzle surface (ink ejection surface) of the print unit 102, and conveys the recording paper 116 while keeping the recording paper 116 flat; a print determination unit 124, which reads out the print results of the print unit 102; and a paper output unit 126, which outputs printed recording paper 116 (a printed object) to the exterior of the inkjet recording apparatus 100.

The heads 3K, 3C, 3M and 3Y constituting the print unit 102 are the inkjet recording heads 3 according to the above-described embodiment of the present invention.

The decurling unit 120 carries out decurling of the recording paper 116 by applying heat to the recording paper 116 by means of a heating drum 130 in a direction opposite to the curl direction.

In the apparatus in which roll paper is used, a cutter 128 is arranged in the stage after the decurling unit 120 as shown in FIG. 2, and the continuous paper is cut into a desired size with the cutter 128. The cutter 128 has a stationary blade 128A, whose length is not less than the width of the conveyor pathway of the recording paper 116, and a round blade 128B, which moves along the stationary blade 128A. The stationary blade 128A is disposed on the opposite side of the print surface of the recording paper 116, and the round blade 128B is disposed on the print surface side across the conveyor pathway. The cutter 128 is not required in an apparatus in which cut papers are used.

The decurled and cut recording paper 116 is delivered to the suction belt conveyance unit 122. The suction belt conveyance unit 122 has a configuration in which an endless belt 133 is set around rollers 131 and 132 so that the portion of the endless belt 133 facing at least the nozzle face of the print unit 112 and a sensor face of the print determination unit 124 forms a horizontal plane (flat plane).

The belt 133 has a width that is greater than the width of the recording paper 116, and a plurality of suction apertures (not shown) are formed in the belt surface. A suction chamber 134 is disposed in a position facing the nozzle surface of the print unit 102 and the sensor surface of the print determination unit 124 on the interior side of the belt 133, which is set around the rollers 131 and 132. The suction chamber 134 provides suction with a fan 135 to generate a negative pressure, and the recording paper 116 is held by suction on the belt 133.

The belt 133 is driven in the clockwise direction in FIG. 2 by the motive force of a motor (not shown) being transmitted to at least one of the rollers 131 and 132, which the belt 133 is set around, and the recording paper 116 held on the belt 133 is conveyed from left to right in FIG. 2.

Since ink adheres to the belt 133 when a marginless print job or the like is performed, a belt-cleaning unit 136 is disposed in a predetermined position (a suitable position outside the printing area) on the exterior side of the belt 133.

A heating fan 140 is disposed on the upstream side of the print unit 102 in the conveyance pathway formed by the suction belt conveyance unit 122. The heating fan 140 blows heated air onto the recording paper 116 to heat the recording paper 116 immediately before printing so that the ink deposited on the recording paper 116 dries more easily.

The print unit 102 includes so-called full line type heads (see FIG. 3) in which line heads having a length corresponding to the maximum paper width are arranged in a direction (the main scanning direction) which is perpendicular to the paper feed direction. The print heads 3K, 3C, 3M and 3Y are constituted as line heads, in which a plurality of ink ejection ports (nozzles) are arranged through a length exceeding at least one edge of the recording paper 116 of maximum size which can be used in the inkjet recording apparatus 100.

The heads 3K, 3C, 3M and 3Y corresponding to respective colored inks are disposed in the order black (K), cyan (C), magenta (M) and yellow (Y), from the upstream side following the direction of conveyance of the recording paper 116.

By ejecting the colored inks respectively from the heads 3K, 3C, 3M and 3Y while conveying the recording paper 116, a color image is recorded on the recording paper 116.

The print determination unit 124 includes a line sensor, or the like, which captures an image of the droplet ejection results of the print unit 102, and determines ejection defects, such as nozzle blockages, from the droplet ejection image read in by the line sensor.

A post-drying unit 142 including a heating fan, or the like, which dries the printed image surface is arranged in the stage after the print determination unit 124. It is desirable to avoid contact with the print surface until the ink after printing has been dried, and therefore a method which blows a heated air flow is preferable.

In order to control the luster of the image surface, a heat and pressure applying unit 144 is arranged in the stage after the post-drying unit 142. In the heat and pressure applying unit 144, the image surface is pressed by a pressing roller 145 having a prescribed surface undulation shape while being heated, and an undulating shape is transferred to the image surface.

The printed matter obtained in this manner is outputted from the paper output unit 126. The target print (i.e., the result of printing the target image) and the test print are preferably outputted separately. In the inkjet recording apparatus 100, a sorting device (not shown) is arranged for switching the outputting pathways in order to sort the printed matter with the target print and the printed matter with the test print, and to send them to paper output units 126A and 126B, respectively.

When the target print and the test print are simultaneously formed in parallel on the same large sheet of paper, the test print portion may be cut and separated by a cutter (second cutter) 148. The structure of the cutter 148 is the same as the first cutter 128 described above, and has a stationary blade 148A and a round blade 148B.

The inkjet recording apparatus 100 has the composition described above.

Piezoelectric Ultrasonic Oscillator (Ultrasonic Transducer)

Figure 4:
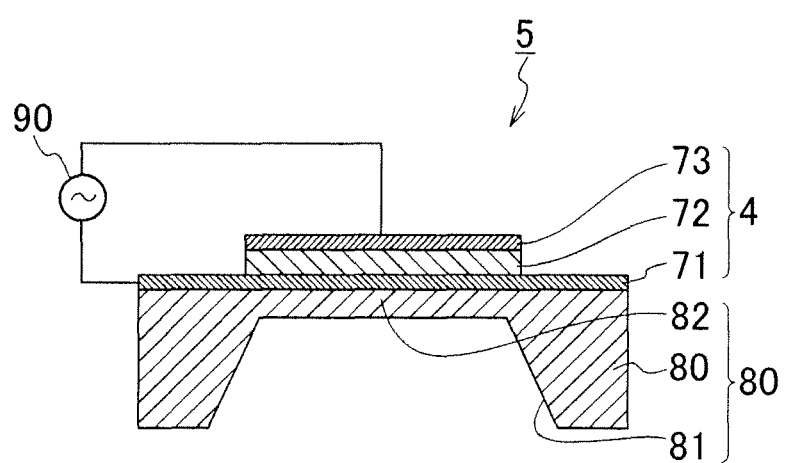
FIG. 4 is a cross-sectional diagram showing the structure of a piezoelectric ultrasonic oscillator according to an embodiment of the present invention.

The structure of a piezoelectric ultrasonic oscillator according to an embodiment of the present invention is described with reference to FIG. 4. FIG. 4 is a principal cross-sectional diagram of a piezoelectric ultrasonic oscillator 5. To clarify the illustration, the scale is altered appropriately for each constituent element from the actual scale.

The piezoelectric ultrasonic oscillator 5 according to the present embodiment generally includes: an SOI substrate 80 having an open pool structure in which a cavity section 81, a diaphragm 82, and a supporting section 83, which supports the diaphragm 82, are formed in an integrated fashion by reactive ion etching (RIE) from the lower surface side; a piezoelectric element 4, which is formed on the substrate 80; and an RF power source (high-frequency AC power source) 90, which applies a high-frequency AC voltage to electrodes 71 and 73 of a piezoelectric element 4. The piezoelectric element 4 has a layered structure constituted of the lower electrode 71, a piezoelectric film 72 and the upper electrode 73, from the substrate 80 side.

The compositions and thicknesses of the lower electrode 71 and the upper electrode 73 are similar to the lower electrode 20 and the upper electrode 40 of the piezoelectric element 1 in FIG. 1. The piezoelectric film 72 is constituted of the columnar structure film according to the present invention.

When an AC electric signal having a frequency in the ultrasonic range is applied to the electrodes 71 and 73 of the piezoelectric element 4, a bending vibration is generated in the piezoelectric element 4 at the same frequency as the applied AC electric signal, and the diaphragm 82 performs a bending vibration in unison with the piezoelectric element 4. In this case, since the diaphragm 82 vibrates in a state where the peripheral edge portions thereof are supported by the supporting section 83, then an ultrasonic wave of the same frequency as the applied AC electric signal is radiated from the side of the diaphragm 82 opposite from the side of the piezoelectric element 4.

The piezoelectric ultrasonic oscillator 5 according to the present embodiment has the composition described above. According to the present embodiment, it is possible to provide the piezoelectric ultrasonic oscillator 5 having excellent voltage tolerance and excellent driving durability.

The piezoelectric ultrasonic oscillator 5 according to the present embodiment can be used in an ultrasonic motor, or the like.

The piezoelectric ultrasonic oscillator 5 according to the present embodiment can be used in a sensor, an ultrasonic probe, or the like, which generates an ultrasonic wave of a particular frequency and detects the ultrasonic wave reflected back from an object. When the diaphragm 82 vibrates due to receiving the ultrasonic wave reflected back from the object, the piezoelectric film 72 is displaced in accordance with the related stress and a voltage corresponding to the amount of this displacement is generated in the piezoelectric element 4. By determining this voltage, it is possible to determine the shape of the object, or the like.

Design Modifications

The present invention is not limited to the embodiment described above and the design thereof can be modified appropriately within a range that does not deviate from the essence of the present invention.

EXAMPLES

Practical examples relating to the present invention are described below.

Experimental Example 1

A TiW film having a thickness of 50 nm and an Ir film having a thickness of 150 nm were successively deposited as a lower electrode on a silicon substrate by sputtering, at a substrate temperature of 350° C. A Nb-doped PZT piezoelectric film having a thickness of 3.9 µm was deposited over the lower electrode. The RF input power was altered during the course of deposition of the piezoelectric film. The film forming conditions were as described below.

Film forming apparatus: RF sputtering apparatus;
Target: 120 mm-diameter sintered body of $Pb_{1.3}(Zr_{0.46}Ti_{0.42}Nb_{0.12})O_3$;
Substrate temperature: 475° C.;
Target to substrate distance (T-S distance): 60 mm;
Film formation pressure: 0.3 Pa (2.3 mTorr);
Film formation gas: $Ar/O_2$=97.5/2.5 (in mol ratio); and
Input power: 500 W for 40 minutes from start of film formation, and then 700 W for subsequent 30 minutes.

Figure 5:
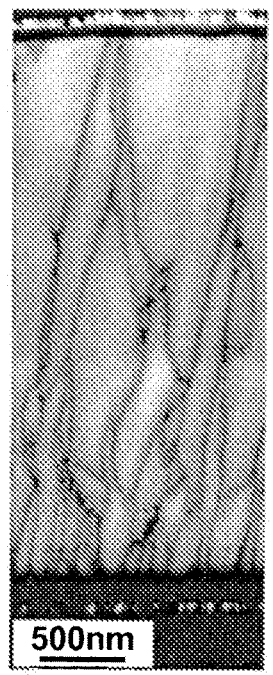
FIG. 5 is a cross-sectional EBSD image of a piezoelectric film according to Experimental Example 1.

An electron backscatter diffraction (EBSD) measurement was carried out for the obtained piezoelectric film. FIG. 5 shows a cross-sectional EBSD image of the piezoelectric film obtained in Experimental Example 1. As shown in FIG. 5, the obtained piezoelectric film was a columnar structure film constituted of a plurality of columnar bodies extending in non-parallel directions to the substrate surface; and in the columnar structure film, the average column diameters taken in planes perpendicular to the film thickness direction became continuously larger in the upward direction from the lower electrode side.

Figure 7:
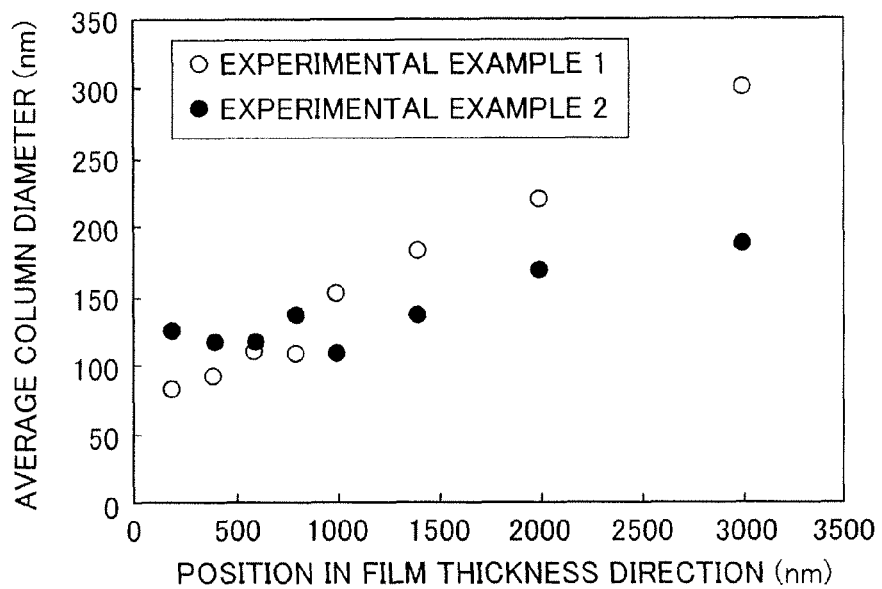
FIG. 7 is a graph showing the relationship between the position in the film thickness direction of the piezoelectric film and the average column diameter, in Experimental Examples 1 and 2.

The relationship between the position in the film thickness direction from the lower surface (substrate side surface) of the piezoelectric film and the average column diameter taken in the plane perpendicular to the film thickness direction (i.e., in the plane parallel to the lower surface of the piezoelectric film) is shown in Table 1 and FIG. 7. The following values were obtained: $GS_{max}$=300 nm, $GS_{min}$=82 nm, and $GS_{max}/GS_{min}$=3.65.

TABLE 1

| Position in film thickness direction from lower surface (nm) | Average column diameter (nm) | |
| --- | --- | --- |
| | Experimental Example 1 | Experimental Example 2 |
| 200 | 82 | 125 |
| 400 | 92 | 115 |
| 600 | 110 | 115 |
| 800 | 107 | 136 |
| 1000 | 150 | 107 |
| 1400 | 183 | 136 |
| 2000 | 219 | 167 |
| 3000 | 300 | 188 |
| $GS_{max}/GS_{min}$ | 3.65 | 1.75 |
| Voltage tolerance (V) | 256 | 82 |

A Pt/Ti upper electrode (a Pt film having a thickness of 150 nm and a Ti film having a thickness of 30 nm) was vapor deposited onto the above-described piezoelectric film, and this electrode was patterned to create a plurality of circular patterns having a diameter of 400 μm, thereby yielding the piezoelectric elements according to the present invention.

A DC voltage was applied between the lower electrode and the upper electrode, and the voltage tolerance was measured by taking the point at which the current value became 1 μA or greater, as the insulation breakdown voltage. The voltage tolerance was measured in five points on different upper electrodes, and the average value thereof was determined. The voltage tolerance of the piezoelectric film was 236 V (=605 kV/cm).

When a driving durability test was carried out by applying a square wave signal having a peak-to-peak voltage of 35 V and a frequency of 30 kHz to the obtained piezoelectric element, no deterioration was observed even after driving for $3 \times 10^{11}$ cycles.

Experimental Example 2

A piezoelectric element for the purpose of comparison was obtained similarly to Experimental Example 1, apart from the fact that a piezoelectric film was formed under the same conditions from start to finish, rather than altering the film forming conditions of the piezoelectric film during the course of film formation. The film forming conditions of the piezoelectric film were as described below.

Film forming apparatus: same as Experimental Example 1;
Target: same as Experimental Example 1;
Substrate temperature: same as Experimental Example 1;
Target to substrate distance (T-S distance): same as Experimental Example 1;
Film formation pressure: same as Experimental Example 1;
Film formation gas: same as Experimental Example 1;
Input power: 500 W; and
Film formation time: 90 minutes.

Figure 6:
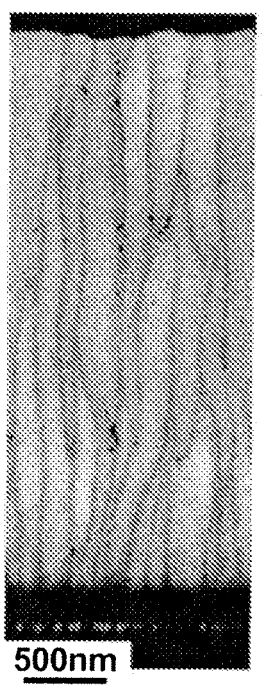
FIG. 6 is a cross-sectional EBSD image of a piezoelectric film according to Experimental Example 2.

An EBSD measurement was carried out for the obtained piezoelectric film. FIG. 6 shows a cross-sectional EBSD image of the piezoelectric film obtained in Experimental Example 2. As shown in FIG. 6, the obtained piezoelectric film was a columnar structure film constituted of a plurality of columnar bodies extending in non-parallel directions to the substrate surface; and in the columnar structure film, no significant change in the average column diameter was seen along the film thickness direction, contrary to Experimental Example 1.

The relationship between the position in the film thickness direction from the lower surface (substrate side surface) of the piezoelectric film and the average column diameter taken in the plane perpendicular to the film thickness direction is shown in Table 1 and FIG. 7. The following values were obtained: $GS_{max}$=188 nm, $GS_{min}$=107 nm, and $GS_{max}/GS_{min}$=1.75.

Tolerance voltage measurement was carried out similarly to Experimental Example 1, and the voltage tolerance was 82 V (=205 kV/cm).

When a driving durability test was carried out on the piezoelectric element thus obtained using a square wave signal having a peak-to-peak voltage of 35 V and a frequency of 30 kHz similarly to Experimental Example 1, insulation breakdown occurred when the piezoelectric element had been driven through $5 \times 10^9$ cycles, and the piezoelectric film was destroyed.

Experimental Example 3

Piezoelectric elements were obtained by forming a variety of piezoelectric films having different values for $GS_{max}/GS_{min}$, similarly to the Experimental Examples 1 and 2, by altering the film formation conditions variously. Table 2 shows film formation conditions.

TABLE 2

| | | | Film formation conditions | | | | | |
| --- | --- | --- | --- | --- | --- | --- | --- | --- |
| $GS_{max}/GS_{min}$ | $GS_{max}$ (nm) | Voltage tolerance (V) | Power (W) | Pressure (Pa) | $V_{DC}$ (V) | T-S distance (mm) | Film formation time (min) | Film formation temperature (° C.) |
| 1.57 | 150 | 150 | 480 | 1.0 | −270 | 80 | 80 | 520 |
| 1.60 | 286 | 125 | 480 | 1.5 | −220 | 80 | 80 | 520 |
| 1.75 | 188 | 205 | 500 | 0.3 | −170 | 60 | 90 | 475 |
| 1.80 | 250 | 225 | 480 | 1.0 | −270 | 90 | 80 | 520 |
| 2.40 | 286 | 350 | 500 | 0.3 | −185 | 60 | 90 | 475 |
| 3.00 | 280 | 450 | 500 → 600 | 0.3 | −170 → −190 | 60 | 40 → 30 | 475 |
| 3.65 | 300 | 605 | 500 → 700 | 0.3 | −170 → −200 | 60 | 40 → 30 | 475 |

In Table 2, the symbol "→" indicates that the film formation conditions were altered during the course of film formation similarly to the Experimental Example 1. In the table, "T-S distance" means the target to substrate distance, and "$V_{DC}$" means the target self bias during the film formation.

Figure 8:
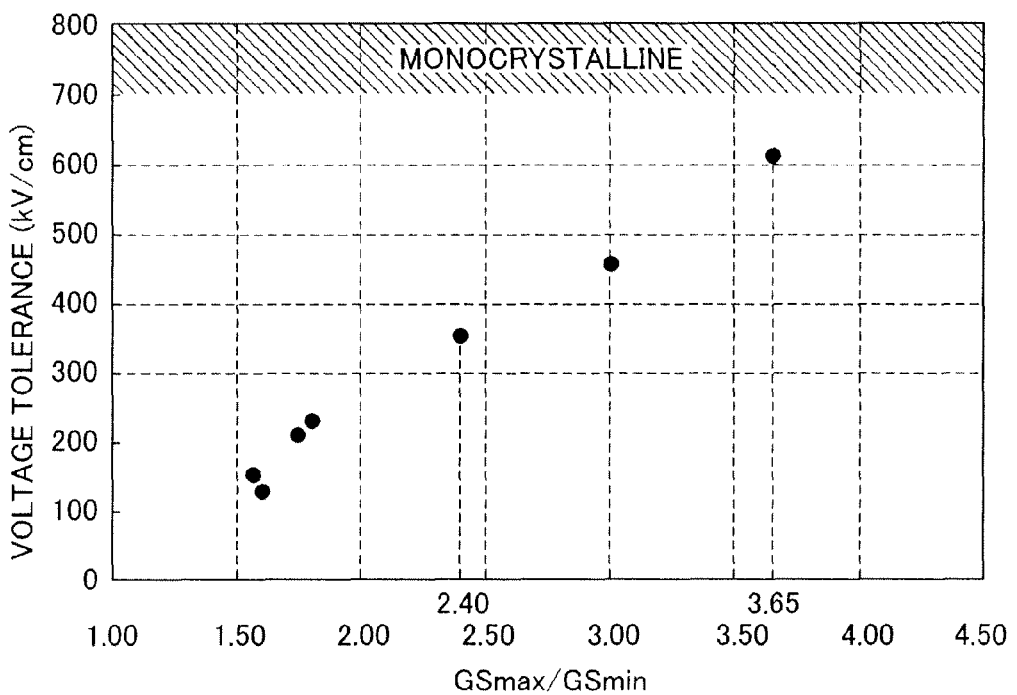
FIG. 8 is a graph summarizing the results of Experimental Examples 1 to 3.

Table 2 and FIG. 8 show the results of Experimental Examples 1 to 3. Table 2 shows also the $GS_{max}$ values for the samples, for reference purposes. Each of these $GS_{max}$ values was obtained in the periphery of the film surface.

Also for reference purposes, FIG. 8 shows the voltage tolerance level of a monocrystalline body of the same composition (700 to 800 kV/cm). FIG. 8 shows that the greater the ratio $GS_{max}/GS_{min}$, the further the voltage tolerance improves.

In Experimental Examples 1 to 3, columnar structure films having ratios of $1.5 < GS_{max}/GS_{min} \leq 3.65$ were obtained, and high voltage tolerance was achieved at $2.0 < GS_{max}/GS_{min} \leq 3.65$, desirably, $2.5 \leq GS_{max}/GS_{min} \leq 3.65$, and most desirably, $3.0 \leq GS_{max}/GS_{min} \leq 3.65$. At $GS_{max}/GS_{min} = 3.65$, the voltage tolerance characteristics close to those of a monocrystalline body were obtained.

Manufacture of Piezoelectric Ultrasonic Oscillator

A TiW film having a thickness of 50 nm and an Ir film having a thickness of 150 nm were successively deposited as a lower electrode on an SOI substrate. A Nb-doped PZT piezoelectric film was deposited over the lower electrode under the similar conditions to Experimental Example 1. A Pt film having a thickness of 100 nm was deposited as an upper electrode over the piezoelectric film. By RIE processing of the SOI substrate from the lower surface side, a cavity structure having cavity portions of 720 μm by 300 μm was formed, thereby manufacturing a piezoelectric ultrasonic oscillator. The resonance frequency was 1 MHz. Another piezoelectric ultrasonic oscillator having the piezoelectric film according to Experimental Example 2 was similarly manufactured.

When ultrasonic waves were continuously generated under the aforementioned resonance conditions by the piezoelectric ultrasonic oscillators having the films according to Experimental Example 1 and Experimental Example 2, respectively, the piezoelectric ultrasonic oscillator having the film according to Experimental Example 1 had a lifespan approximately five times that of the piezoelectric ultrasonic oscillator having the film according to Experimental Example 2.

The columnar structure film according to the present invention can be applied desirably to a piezoelectric film, or the like. The piezoelectric film according to the present invention can be used desirably in a piezoelectric element, piezoelectric ultrasonic oscillator, piezoelectric generating element, or the like, which is mounted in an inkjet recording head, a magnetic recording and reproduction head, a MEMS (micro electro-mechanical systems) device, a micro-pump, an ultrasonic probe, an ultrasonic motor, or the like, or in a ferroelectric element, such as a ferroelectric memory, or the like.

It should be understood, however, that there is no intention to limit the invention to the specific forms disclosed, but on the contrary, the invention is to cover all modifications, alternate constructions and equivalents falling within the spirit and scope of the invention as expressed in the appended claims.

What is claimed is:

1. A columnar structure film which is formed on a surface of a substrate by vapor phase epitaxy and is constituted of a plurality of columnar bodies extending in directions non-parallel to the surface of the substrate wherein:

a relationship $GS_{max} > 2.0\ GS_{min}$ is satisfied, where $GS_{max}$ and $GS_{min}$ are respectively a maximum value and a minimum value of average diameters of the columnar bodies taken in planes perpendicular to a thickness direction of the columnar structure film;

among the average diameters of the columnar bodies taken in the planes perpendicular to the thickness direction of the columnar structure film, the average diameter at a first surface of the columnar structure film adjacent to the substrate is smallest, and the average diameter at a second surface of the columnar structure film opposite to the first surface is greatest; and the average diameters of the columnar bodies taken in the planes perpendicular to the thickness direction of the columnar structure film continuously change along the thickness direction of the columnar structure film.

2. The columnar structure film as defined in claim 1, wherein a relationship $GS_{max} \geq 2.5\ GS_{min}$ is satisfied.

3. The columnar structure film as defined in claim 2, wherein a relationship $GS_{max} \geq 3.0\ GS_{min}$ is satisfied.

4. The columnar structure film as defined in claim 1, wherein an insulation breakdown voltage defined by an applied voltage at which a current value becomes not lower than 1 μA is not lower than 300 kV/cm.

5. The columnar structure film as defined in claim 1, wherein the columnar structure film is formed by vapor phase epitaxy using plasma.

6. The columnar structure film as defined in claim 1, wherein the columnar structure film is a dielectric film.

7. The columnar structure film as defined in claim 1, wherein the columnar structure film is a piezoelectric film.

8. The columnar structure film as defined in claim 7, containing at least one of perovskite type oxides expressed as $ABO_3$, where A is an A site element and at least one element including Pb; B is a B site element and at least one element selected from a group consisting of Ti, Zr, V, Nb, Ta, Sb, Cr, Mo, W, Mn, Sc, Co, Cu, In, Sn, Ga, Zn, Cd, Fe and Ni; O is oxygen, and a standard mol ratio of the A site element, the B site element and oxygen is 1:1:3 but the mol ratio may deviate from the standard mol ratio within a range that enables a perovskite structure to be obtained.

9. The columnar structure film as defined in claim 8, wherein the perovskite type oxides are expressed as $A_a(Zr_x, Ti_y, M_{b-x-y})_b O_c$, where A is the A site element and the at least one element including Pb; M is at least one of metal elements, relationships $0 < x < b$, $0 < y < b$, and $0 \leq (b-x-y)$ are satisfied, and a:b:c=1:1:3 is standard but the mol ratio may deviate from the standard mol ratio within a range that enables the perovskite structure to be obtained.

10. The columnar structure film as defined in claim 9, wherein M is at least one element selected from a group consisting of V, Nb, Ta and Sb.

11. The columnar structure film as defined in claim 1, wherein the columnar structure film is a ferroelectric film.

12. The columnar structure film as defined in claim 11, containing at least one of perovskite type oxides expressed as $ABO_3$, where A is an A site element and at least one element including Pb; B is a B site element and at least one element selected from a group consisting of Ti, Zr, V, Nb, Ta, Sb, Cr, Mo, W, Mn, Sc, Co, Cu, In, Sn, Ga, Zn, Cd, Fe and Ni; O is oxygen, and a standard mol ratio of the A site element, the B site element and oxygen is 1:1:3 but the mol ratio may deviate from the standard mol ratio within a range that enables a perovskite structure to be obtained.

13. The columnar structure film as defined in claim 12, wherein the perovskite type oxides are expressed as $A_a(Zr_x, Ti_y, M_{b-x-y})_b O_c$, where A is the A site element and the at least one element including Pb; M is at least one of metal elements, relationships $0 < x < b$, $0 < y < b$, and $0 \leq (b-x-y)$ are satisfied, and a:b:c=1:1:3 is standard but the mol ratio may deviate from the standard mol ratio within a range that enables the perovskite structure to be obtained.

14. The columnar structure film as defined in claim 12, wherein M is at least one element selected from a group consisting of V, Nb, Ta and Sb.

15. A piezoelectric element, comprising:
   a piezoelectric film composed of the columnar structure film as defined in claim 7; and
   electrodes through which an electric field is applied to the piezoelectric film.

16. A liquid ejection apparatus, comprising:
   the piezoelectric element as defined in claim 15; and
   a liquid ejection member which is arranged adjacently to the piezoelectric element,
   wherein the liquid ejection member includes a liquid storage chamber in which liquid is stored, and a liquid ejection port through which the liquid is ejected to exterior from the liquid storage chamber in accordance with application of the electric field to the piezoelectric film.

17. A piezoelectric ultrasonic oscillator, comprising:
   the piezoelectric element as defined in claim 15;
   an AC power source which applies an alternating voltage to the electrodes; and
   a diaphragm which vibrates due to expansion and contraction of the piezoelectric film.

* * * * *